US006328872B1

(12) United States Patent
Talieh et al.

(10) Patent No.: US 6,328,872 B1
(45) Date of Patent: Dec. 11, 2001

(54) METHOD AND APPARATUS FOR PLATING AND POLISHING A SEMICONDUCTOR SUBSTRATE

(75) Inventors: Homayoun Talieh, San Jose; Cyprian Emeka Uzoh, Milpitas, both of CA (US)

(73) Assignee: Nutool, Inc., Milpitas, CA (US)

( * ) Notice: Subject to any disclaimer, the term of this patent is extended or adjusted under 35 U.S.C. 154(b) by 0 days.

(21) Appl. No.: 09/285,621

(22) Filed: Apr. 3, 1999

(51) Int. Cl.[7] .............................. C25D 17/00; C25D 5/34; C25D 5/52; C25B 9/00; C25B 11/00

(52) U.S. Cl. .................... 205/206; 205/219; 205/222; 204/212; 204/217; 204/224 R; 204/224 M; 204/252; 204/280

(58) Field of Search ................ 204/224 M, 224 R, 204/280, 271, 212–215, 217, 297 R, 252; 205/287, 222, 640, 206, 219, 220; 118/429

(56) References Cited

U.S. PATENT DOCUMENTS

| 3,395,092 | 7/1968 | Ribes . |
| 3,436,259 | 4/1969 | Regh et al. . |
| 3,890,746 | 6/1975 | Saegusa et al. . |
| 3,959,089 | 5/1976 | Watts . |
| 4,153,523 | * 5/1979 | Koontz et al. ................. 205/206 X |
| 4,395,320 | * 7/1983 | Kasashima et al. ............ 205/222 X |
| 4,610,772 | 9/1986 | Palnik . |

(List continued on next page.)

FOREIGN PATENT DOCUMENTS

| 2008664 | 9/1971 | (DE) . |
| 4324330 | 3/1994 | (DE) . |
| 0903774 A2 | 3/1999 | (EP) . |
| 0960693 A2 | 12/1999 | (EP) . |
| WO95/00295 | 1/1995 | (WO) . |

OTHER PUBLICATIONS

M. Rubinstein, "Tampongalvanisieren in der Praxis, Teil 1." *Galvanotechnik*, vol. 79, No. 10, 1988, pp. 3263–3270, (No month).
J.M. Steigerwald, R. Zirpoli, S.P. Murarka, D. Price and R.J. Gutman, "Pattern Geometry Effects in the Chemical–Mechanical Polishing of Inlaid Copper Structures", Oct. 1994, p. 2842–2848.
Alan C. West, Chin–Chang Cheng and Brett C. Baker, "Pulse Reverse Copper Electrodeposition in High Aspect Ratio Trenches and Vias", Sep. 1998, p. 3070–3073.
Robert C. Contolini, Anthony F. Bernhardt and Steven Mayer, "Electrochemical Planarization for Multilevel Metallization", Sep. 1994, p. 2503–2510.
C. Madore, M. Matlosz and D. Landolt, "Blocking Inhibitors in Catholic Leveling", I. Theoretical Analysis, Dec. 1996, p. 3927–3942.

*Primary Examiner*—Donald R. Valentine
(74) *Attorney, Agent, or Firm*—Pillsbury Winthrop LLP

(57) ABSTRACT

The present invention provides a method and apparatus that plates/deposits a conductive material on a semiconductor substrate and then polishes the same substrate. This is achieved by providing multiple chambers in a single apparatus, where one chamber can be used for plating/depositing the conductive material and another chamber can be used for polishing the semiconductor substrate. The plating/depositing process can be performed using brush plating or electro chemical mechanical deposition and the polishing process can be performed using electropolishing or chemical mechanical polishing. The present invention further provides a method and apparatus for intermittently applying the conductive material to the semiconductor substrate and also intermittently polishing the substrate when such conductive material is not being applied to the substrate. Furthermore, the present invention provides a method and apparatus that plates/deposits and/or polishes a conductive material and improves the electrolyte mass transfer properties on a substrate using a novel anode assembly.

50 Claims, 10 Drawing Sheets

U.S. PATENT DOCUMENTS

| | | | |
|---|---|---|---|
| 4,919,769 | * 4/1990 | Lin | 205/206 |
| 5,024,735 | 6/1991 | Kadija . | |
| 5,171,412 | 12/1992 | Talieh et al. | 204/192 |
| 5,429,733 | 7/1995 | Ishida | 204/234 |
| 5,558,568 | 9/1996 | Talieh et al. | 451/303 |
| 5,650,039 | 7/1997 | Talieh | 156/636 |
| 5,692,947 | 12/1997 | Talieh et al. | 451/41 |
| 5,755,859 | 5/1998 | Brusic et al. | 106/1.22 |
| 5,807,165 | 9/1998 | Uzoh et al. | 451/41 |
| 5,833,820 | 11/1998 | Dubin | 204/212 |
| 5,863,412 | 1/1999 | Ichinose et al. | 205/652 |
| 5,930,669 | 7/1999 | Uzoh | 438/627 |
| 5,933,753 | 8/1999 | Simon et al. | 438/629 |
| 6,004,880 | 12/1999 | Liu et al. . | |
| 6,017,820 | * 1/2000 | Ting et al. | 156/345 X |

* cited by examiner

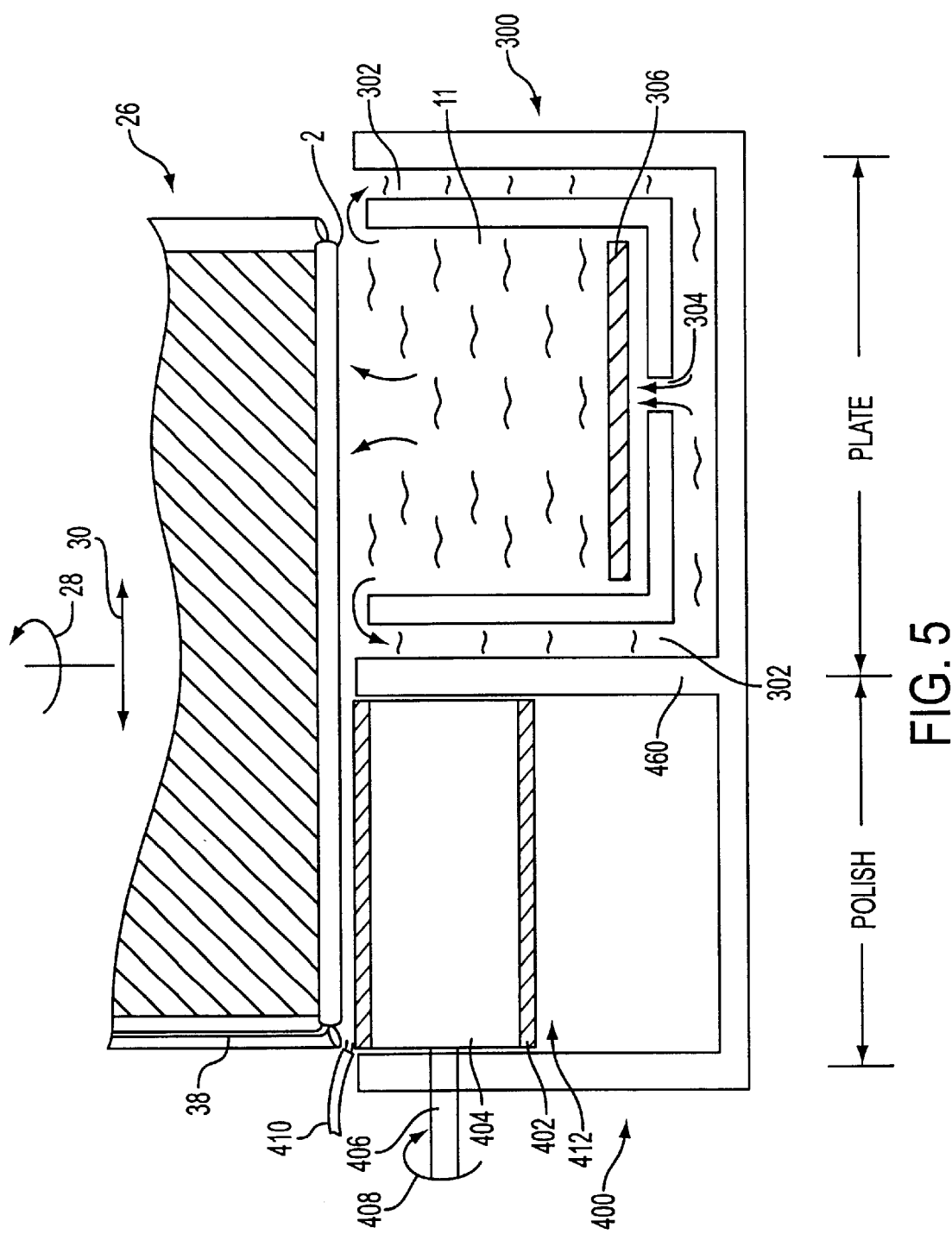

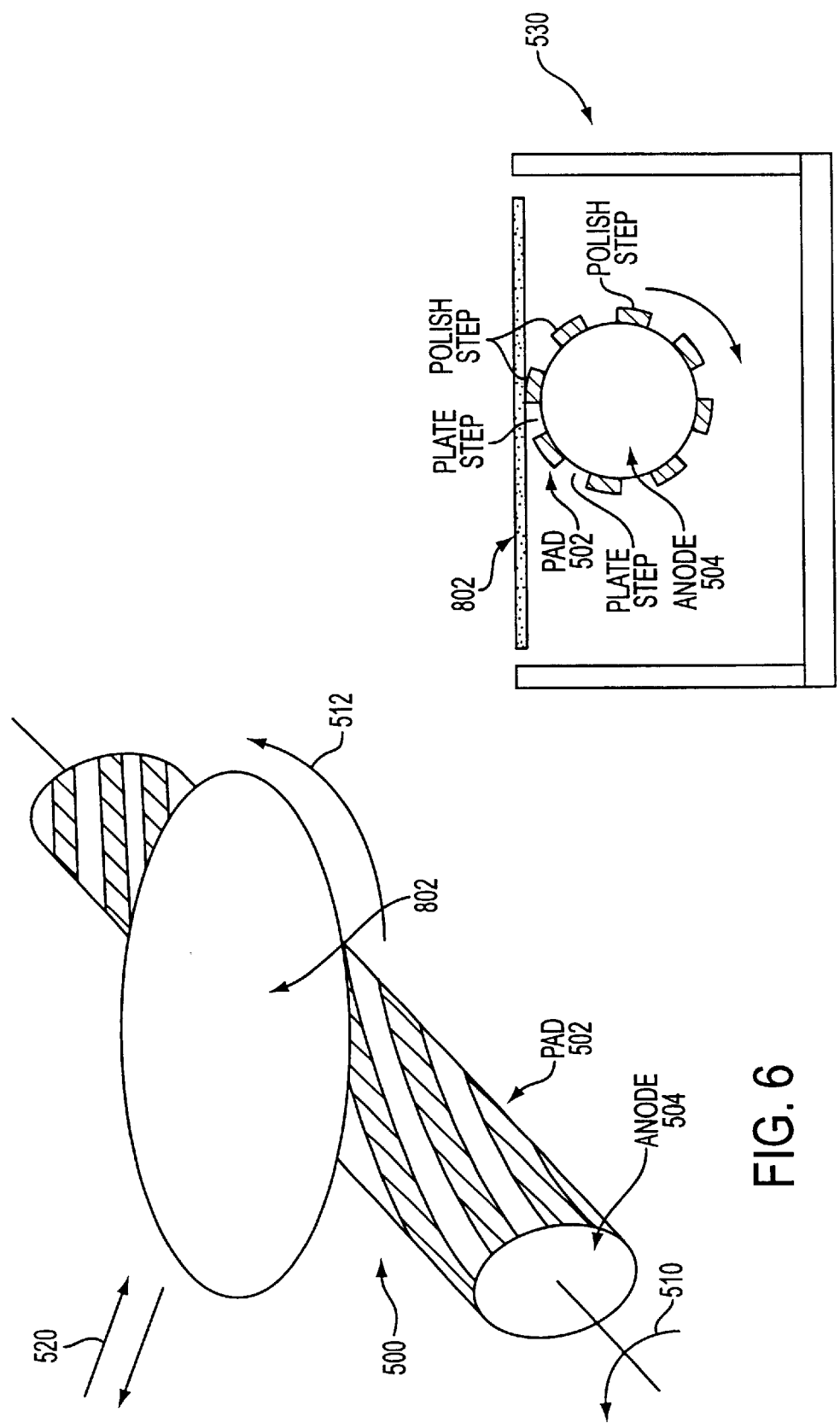

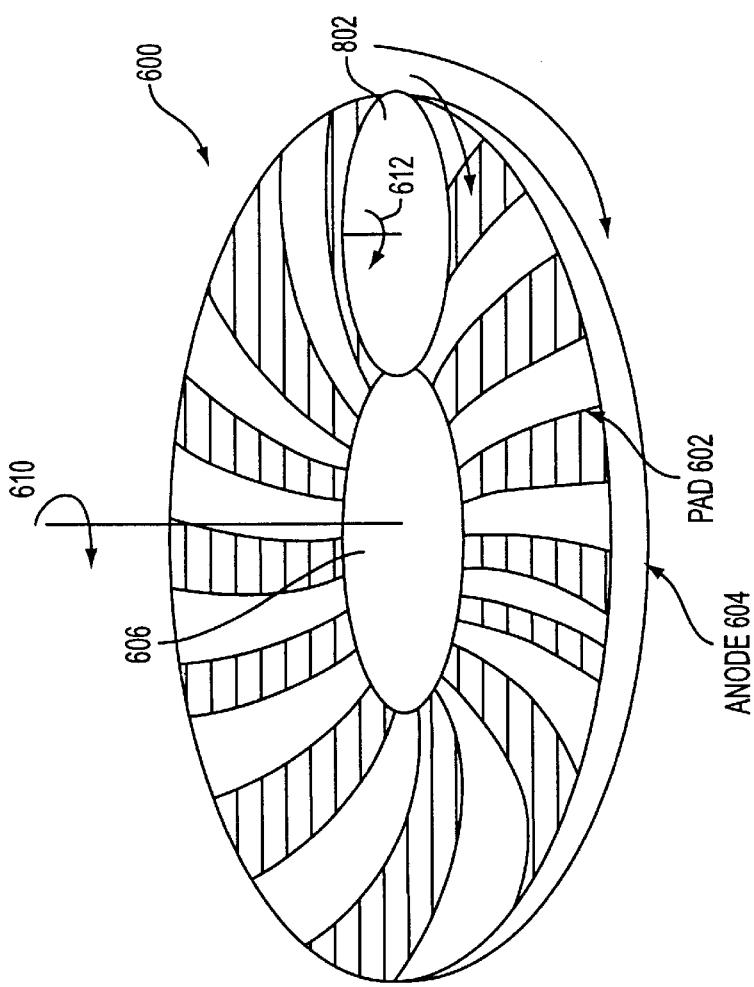
FIG. 8
FIG. 9

METHOD AND APPARATUS FOR PLATING AND POLISHING A SEMICONDUCTOR SUBSTRATE

This application is related to the PCT application No. PCT/US00/08336, filed Mar. 29, 2000.

FIELD OF THE INVENTION

The present invention relates to a method and apparatus for plating and polishing a conductive material on a semiconductor substrate. More particularly, the present invention is directed to a method and apparatus for first plating and then polishing the conductive material on the semiconductor substrate using a single apparatus. Moreover, the present invention is directed to a method and apparatus for intermittently applying the conductive material to the semiconductor substrate and also intermittently polishing the substrate when such conductive material is not being applied to the substrate. Also, the present invention provides a method and apparatus that plates/deposits and/or polishes a conductive material on a substrate surface using a novel pad assembly.

BACKGROUND OF THE INVENTION

A conventional process step in the manufacturing of integrated circuits and devices involves plating a metal layer on a semiconductor wafer surface using a plating apparatus. Typically, the wafer surface has been previously etched and contains many holes and/or trenches. One goal of wafer plating is to uniformly fill the holes and trenches with a conductive material. However, it is very difficult to uniformly fill the holes and trenches such that no voids exist. It is well known that the existence of the voids results in poor performance and defective devices. After such plating step, a polishing step is typically performed using a polishing apparatus to achieve a generally planar surface on the wafer.

Plating the wafer surface with the conductive material over a seed metal layer has important and broad application in the semiconductor industry. Traditionally, aluminum and other metals are plated as one of many metal layers that make up a semiconductor chip. However, in recent times, there is great interest in copper deposition for interconnects on semiconductor chips, because, compared to aluminum, copper reduces electrical resistance and allows semiconductor chips to run faster with less heat generation, resulting in a significant gain in chip capacity and efficiency. Furthermore, copper is known to be a better conductor than aluminum.

Thin film plating of copper into sub-micron holes and trenches is becoming more difficult in ULSI chip processing, particularly when the feature size is below 0.25 $\mu$m with the aspect ratio greater than 5 to 1. Common chemical vapor deposition is being used to fill these holes and trenches etched into silicon substrates. Unfortunately, this process so far has yielded a very high cost for developing and integrating interconnects for ULSI technology.

Accordingly, a more accurate, cost effective, and reliable manner of applying a conductive material to the semiconductor substrate is needed.

SUMMARY OF THE INVENTION

It is an object of the present invention to provide a method and apparatus that plates/deposits a conductive material on a semiconductor workpiece surface and then polishes the same workpiece surface.

It is another object of the present invention to provide a method and apparatus that plates/deposits a conductive material on a workpiece surface using brush plating or electro chemical mechanical deposition and polishes the same workpiece surface using electropolishing or chemical mechanical polishing.

It is a further object of the present invention to provide a method and apparatus having multiple chambers in a single apparatus for plating/depositing the conductive material and polishing the workpiece surface.

It is yet another object of the present invention to provide a method and apparatus having novel pad assemblies for both plating/depositing the conductive material and polishing the workpiece surface.

It is yet another object of the present invention to provide a method and apparatus that plates/deposits a conductive material on a workpiece surface without a pad or other fixed feature making direct contact with the workpiece surface.

These and other object of the present invention are obtained by providing separate plating and polishing steps in close proximity of each other in a single apparatus. A first chamber may be used to plate/deposit the conductive material from an electrolyte solution to the workpiece surface. This is achieved by providing a pad mounted on a cylindrical anode and applying the conductive material to the workpiece surface using the electrolyte solution disposed on the pad, or through the pad.

An apparatus that performs such plating includes an anode and a cathode, a workpiece, or a workpiece that is spaced apart from the anode. A pad mounted on the cylindrical anode rotates about a first axis and the workpiece rotates about a second axis, and metal from the electrolyte solution is deposited on the workpiece when a potential difference is applied between the workpiece and the anode.

Alternatively, the plating chamber may include an anode plate spaced apart from the cathode or the workpiece. Upon application of power to the anode plate and the cathode, the electrolyte solution disposed in the plating chamber is used to deposit the conductive material on the workpiece surface.

In a polishing chamber, a pad is also mounted on another cylindrical anode or a cylindrical roller for polishing the workpiece surface. Polishing may be accomplished using either an electropolish or a chemical mechanical polishing method. The polishing of the workpiece surface preferably prevents accumulation of the conductive material to certain areas of the workpiece while providing a generally planar surface.

The present invention further describes novel anode assemblies having unique anode-pad arrangements that can be used to plate and/or polish the workpiece surface.

BRIEF DESCRIPTION OF THE DRAWINGS

These and other objects and advantages of the present invention will become apparent and more readily appreciated from the following detailed description of the presently preferred exemplary embodiment of the invention taken in conjunction with the accompanying drawings, of which:

FIG. 5 illustrates a cross sectional side view of a second preferred embodiment of the present invention;

FIG. 6 illustrates a perspective view of a first novel anode assembly in accordance with the preferred embodiment of the present invention;

FIG. 7 illustrates a cross sectional view of a first novel anode assembly in accordance with the preferred embodiment of the present invention;

FIG. 8 illustrates a perspective view of a second novel anode assembly in accordance with the preferred embodiment of the present invention;

FIG. 9 illustrates a cross sectional view of a second novel anode assembly in accordance with the preferred embodiment of the present invention;

DETAILED DESCRIPTION OF THE PREFERRED EMBODIMENTS

The preferred embodiments of the present invention will now be described with reference to FIGS. 1–12. As noted above, conventional processing uses different equipment, at different times, to obtain conductive material within holes and trenches, or at other desired locations on the surface of a semiconductor wafer that contains many different semiconductor chips. Accordingly, the equipment cost needed to manufacture a high quality semiconductor integrated circuit device can be exorbitant.

The present invention contemplates different embodiments, which allow for the same apparatus, to be used to plate/deposit a conductive material onto the surface and into the contact, via holes, and trenches, as well as to polish the wafer surface. While the present invention can be used with any conductive material, it is especially suited for use with copper as the conductor, and for use in the fabrication of ULSI integrated circuits having submicron features with large aspect ratios. Furthermore, although a semiconductor wafer will be used to describe the preferred embodiments of the present invention, other semiconductor workpieces such as a flat panel or magnetic film head may be used in accordance with the present invention.

Figure 1:
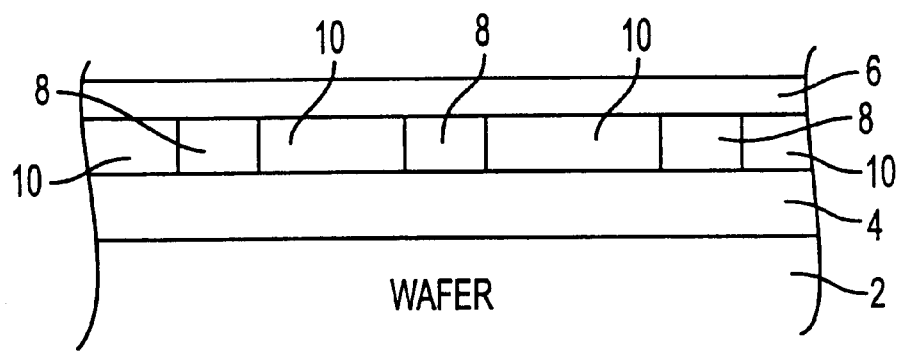
FIG. 1 illustrates a representative via to be filled with a conductor in accordance with the present invention.

FIG. 1 illustrates a section of a wafer 2 where a via is to be formed. The via, as known in the semiconductor arts, is a conductive material that electrically couples different circuit layers. As shown in FIG. 1, the via contains a conductor 8 that can connect a lower level conductive layer 4 with an upper level conductive layer 6, with an insulative material 10 disposed therearound. It is understood that the present invention can operate upon any metal layer of a multi-layer integrated circuit chip.

Figure 2:
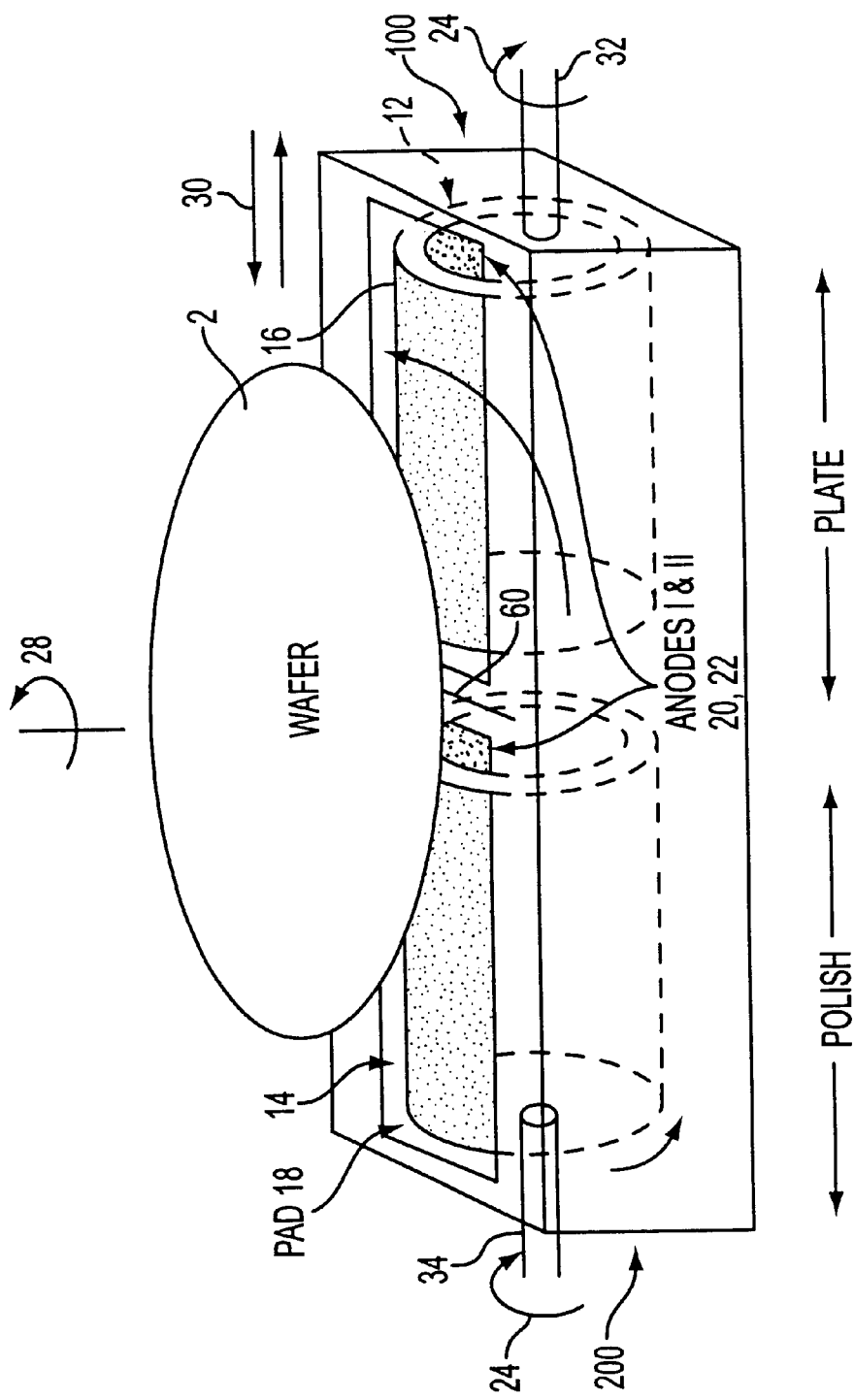
FIG. 2 illustrates a perspective view of a first preferred embodiment of the present invention.
Figure 3:
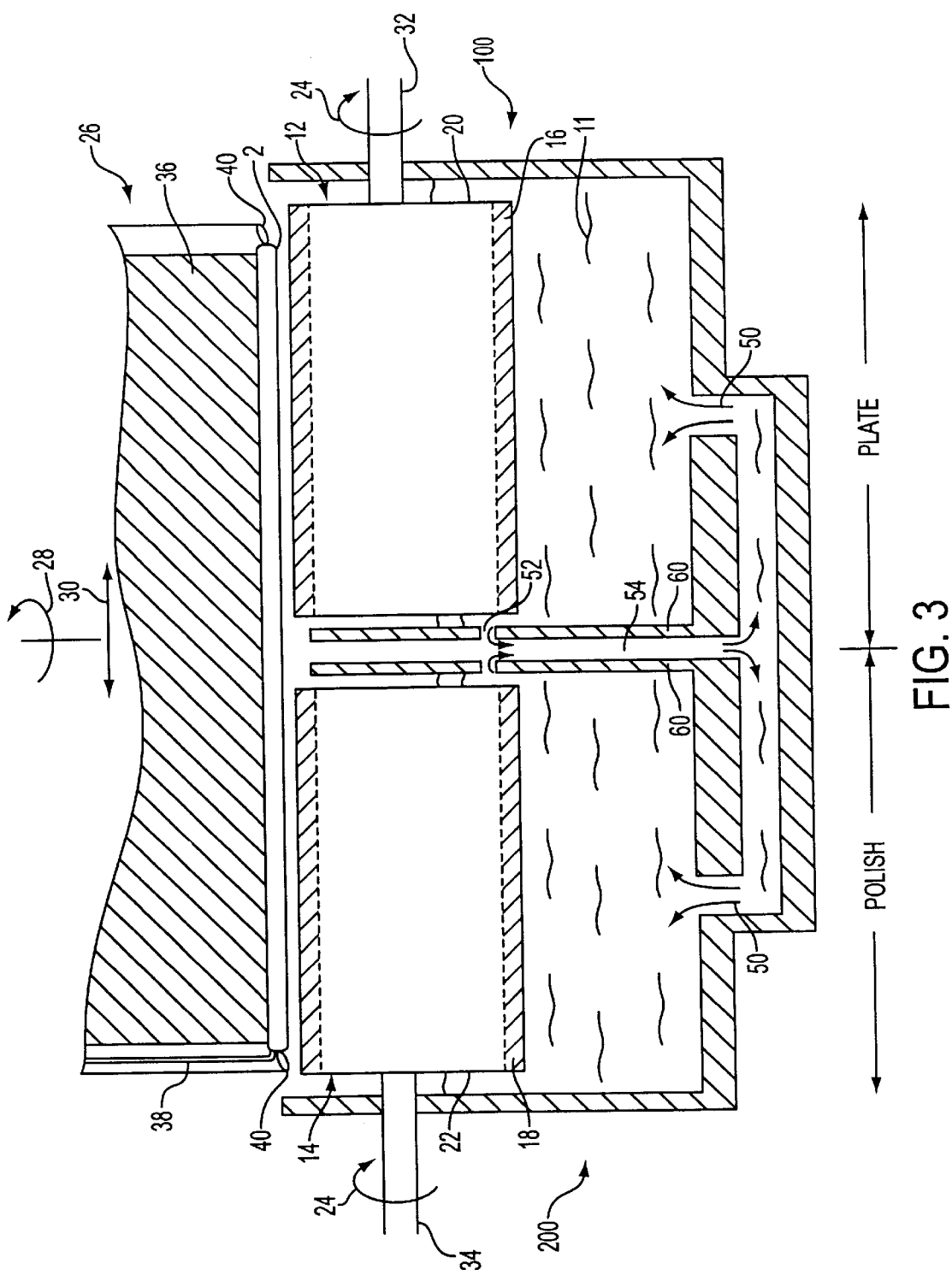
FIG. 3 illustrates a cross sectional view of a first preferred embodiment of the present invention.

FIG. 2 illustrates a perspective view and FIG. 3 illustrates a cross sectional view of a first preferred embodiment of the present invention. Referring back to FIGS. 2–3, a conductive material, preferably copper, is applied in vias, trenches, and/or other desired areas of a wafer using an electrolyte solution 11 from a first chamber 100, while in a second chamber 200, build-up of the conductive material on undesired areas is eliminated, or at least minimized, due to the electropolishing or chemical mechanical polishing performed on the face of the wafer, but not in the contact, via holes, and trenches. The first chamber 100 is separated from the second chamber 200 by a center partition 60.

The first and second chambers 100, 200 each include an anode assembly 12, 14 having a circular or square mechanical pad 16, 18 mounted on a cylindrical anode 20, 22 that rotates around a first axis 24, and a wafer head assembly 26 having a wafer 2 that rotates around a second axis 28. The entire wafer head assembly 26 is further adapted to move side to side in the direction of arrow 30 so that the center area of the wafer 2 can be plated and polished. The cylindrical anodes 20, 22 are connected to shafts 32, 34 for rotating about axis 24. As illustrated, the wafer 2 rotates within an area that is covered by the mechanical pads 16, 18, as will be described in further detail hereinafter, which area is within chambers 100, 200 that keeps the electrolyte solution 11 disposed therein. Although shown as operating upon a single wafer, it is understood that a plurality of wafer head assemblies 26 could be used with the present invention.

With reference to FIG. 3, the wafer head assembly 26 may include a nonconductive, preferably circular, chuck 36 with a cavity that is preferably a few millimeters deep at its center and which cavity may contain a resting pad (not shown). The wafer 2 is loaded into the cavity, backside first, against the resting pad using a conventional type of transport or vacuum mechanism to ensure that the wafer 2 is stationary with respect to the wafer head assembly 26 while in use. A nonconductive retaining ring 40 such as an O-ring or other rubber type of seal at the periphery of the wafer head assembly 26 and a cathode contact electrode 38 each push against the edge of the wafer 2 and hold the wafer 2 in place. The entire back side of the wafer 2 which pushes against the chuck 36 that is under the retaining ring 40 is thus protected from any and all solutions, including electrolyte. Other conventional wafer head assemblies can be used in accordance with the present invention.

Instead of using the cathode contacts 38 described above, the electric potential can be applied to the wafer using a ring conductor. Further, other methods of applying the electric potential to the wafer may be used in accordance with the present invention. For example, a liquid conductor or an inflatable tube coated with a conductive material may be used in the present invention. An example of using the liquid conductor or the conductive tube to provide the necessary electric potential according to the present invention is disclosed in the co-pending U.S. application Ser. No. 09/283,024, filed Mar. 30, 1999, entitled "Method And Apparatus For Forming an Electric Contact With a Semiconductor Substrate", commonly owned by the assignee of the present invention, the contents of which are expressly incorporated herein by reference.

In accordance with the present invention, the first chamber 100 may be used for plating and the second chamber 200 may be used for polishing. The two chambers 100, 200 can be used interchangeably where the first chamber 100 can be used for polishing and the second chamber 200 can be used for plating. As described earlier, the first chamber 100 includes the first anode assembly 12 for plating and the second chamber 200 includes the second anode assembly 14 for electropolishing. Electric potentials are applied to the anode 20, the anode 22 and the wafer 2. Any known method for providing the electric potentials to the two cylindrical anodes can be used in the present invention. As is known in the art, the difference in the amount of electric potential applied to each of the two cylindrical anodes 20, 22 determines which anode assembly is used for plating and which one is used for electropolishing.

An electrolyte solution 11 is flowed from bottom openings 50 of the two chambers 100, 200 until the solution 11 makes contact with the pads 16, 18. The electrolyte solution 11 is further circulated via side openings 52 to channel 54 to the bottom openings 50. The electrolyte solution 11 can be originally fed into the first and second chambers 100, 200 via a reservoir (not shown) through an in-channel (not shown).

In the first chamber 100, a first electric potential difference between the cylindrical anode 20 and the cathode wafer 2 allows the metal in the electrolyte solution 11 to be plated on the wafer surface via pad 16. In the second chamber 200, polishing of the wafer is undertaken by a second electrical potential difference between the cylindrical anode 22 and the cathode wafer 2.

The plating process of the present invention can be implemented using a brush plating method or an "electro chemical mechanical deposition" method. A more detailed description of the "electro chemical mechanical deposition" method can be found in the co-pending U.S. application Ser. No. 09/201,929, now U.S. Pat. No. 6,176,992 and titled "Method and Apparatus For Electro Chemical Mechanical Deposition", commonly owned by the assignee of the present invention, the contents of which are expressly incorporated herein by reference.

The polishing process of the present invention may be implemented by way of electropolishing or by chemical mechanical polishing as described in more detail hereinafter. In operation, it will be appreciated that the roller-shaped mechanical pad 18 polishes the wafer similar to the manner in which a roller sander removes paints from a wall.

In the polishing chamber 200, the mechanical pad 18 can have a size that polishes a section of the wafer 2 at any given time. One or more drive assemblies (not shown) are also included to rotate the cylindrical anodes 20, 22, and thereby the mechanical pads 16, 18, so that they are in contact with the section of the wafer 2 that needs to be plated and polished. The mechanical pads 16, 18 are preferably made of a nonconductive, porous type material such as polyurethane. Also, the mechanical pads 16, 18 preferably have a circular shape, but may be shaped in any other form so long as they can effectively plate and/or polish the wafer.

Figure 4:
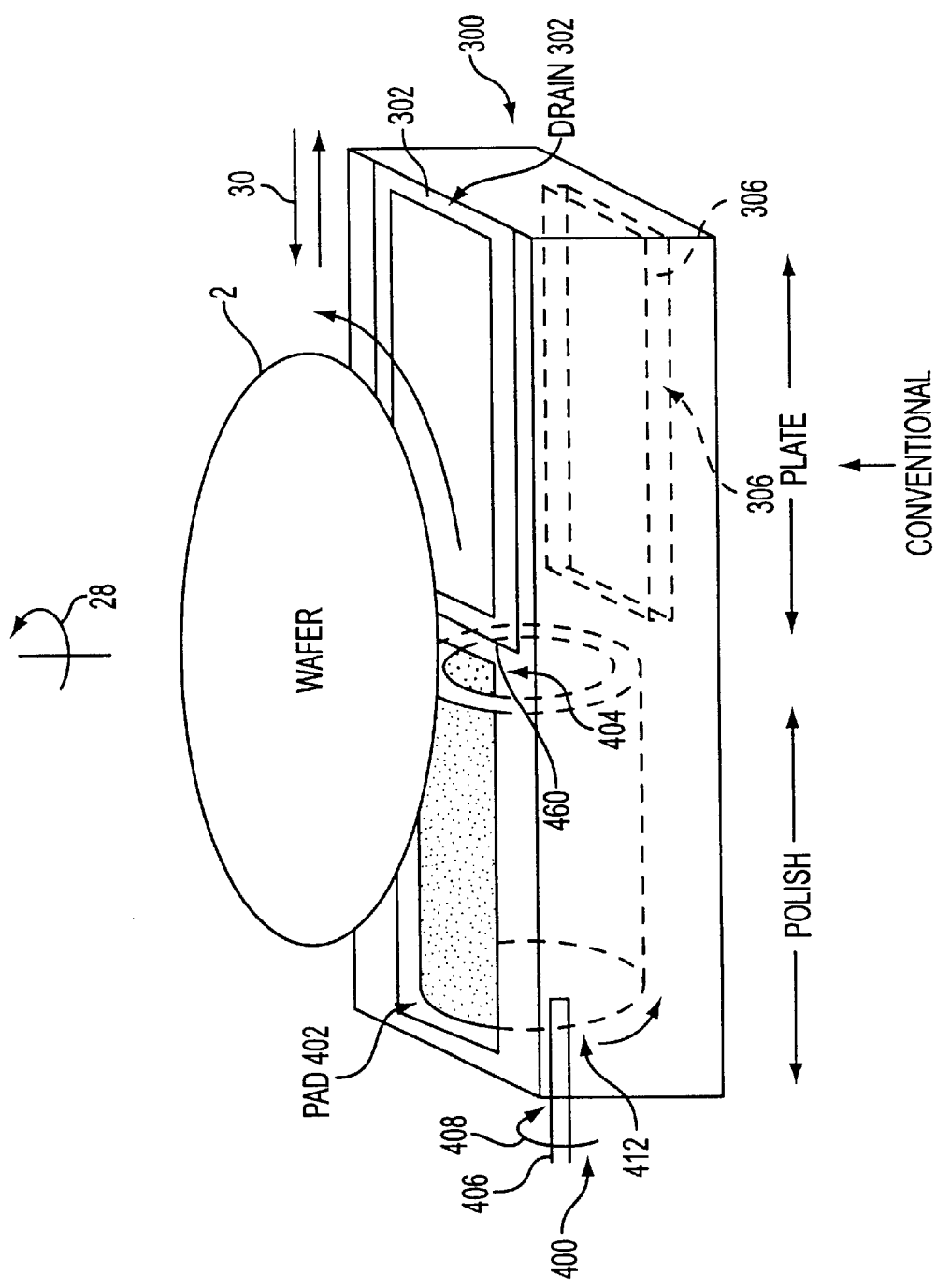
FIG. 4 illustrates a perspective view of a second preferred embodiment of the present invention.

FIG. 4 illustrates a perspective view and FIG. 5 illustrates a cross sectional view of a second preferred embodiment of the present invention. The second preferred embodiment is also implemented with a first chamber 300 for plating and a second chamber 400 for polishing the wafer 2. The first chamber 300 is separated from the second chamber 400 by a center partition/wall 460.

Now referring to FIG. 5, the first chamber 300 includes an anode plate 306 on the bottom of the chamber 300. Any known method for attaching the anode plate 306 or shape to the bottom of the chamber 300 may be used. The electrolyte solution 11 is circulated via drain channels 302 to the bottom opening 304, or through the anode plate 306.

The second chamber 400 includes a mechanical pad 402 mounted on a cylindrical roller 404 for chemical mechanical polishing (CMP) of the wafer 2. A shaft 406 is used to rotate the roller around axis 408. CMP is a material planarization process that combines chemical removal of semiconductor layers such as insulators or metals with mechanical buffering of the substrate surface. CMP may provide global planarization of the wafer surface. For example, during the wafer fabrication process, CMP is often used to polish the profiles that build up in multilevel metal interconnection schemes.

In operation according to the second preferred embodiment of the invention, the apparatus applies, using a power source, a negative potential to the cathode contact 38 and a positive potential to the anode plate/shade 306. When an electric current is established between the two electrodes, metal in electrolyte is deposited on the surface of the wafer 2.

After such deposition, there is also performed a mechanical chemical polishing of the wafer 2 using the mechanical pad assembly 412. A polishing agent or slurry may be applied to the polishing pad 402 via slurry channel 410 to polish the wafer 2. A center wall 420 separating the second chamber 400 from the first chamber 300 should be sufficiently high so that the slurry does not enter the first chamber 300. Other conventional methods for preventing the slurry from entering the plating chamber 300 can be used in the present invention. The mechanical pad assembly 412 substantially prevents metals from becoming permanently deposited on surfaces of the wafer 2 where such a deposit is undesired, due to the polishing or rubbing action of the mechanical pad 402. Accordingly, metal, i.e. copper, is deposited in vias, trenches, and the like where desired, and is substantially prevented from being deposited in undesired areas such as the surface or field area on the wafer.

The wafer head assembly 26 faces toward the mechanical pad assembly 412, and is pushed down with a controlled force. The wafer head assembly 26 is similar to that described with reference to FIGS. 2 and 3 and rotates around axis 28 using a conventional motorized spindle (not shown). The wafer head assembly 26 is also adapted to move side to side in the direction of arrow 30 so that the center area of the wafer 2 may be plated and polished.

The present invention may reduce the need for pulse generating power supplies because the mechanical pulsing that is generated from the movement of the pad creates sufficient pulsing. This mechanical pulsing is created as a result of the wafer being in contact with the pad as it is moved in relation to the wafer. The benefit of the mechanical pulsing is that it improves grain size and copper film integrity without the need for power supplies with pulsing capabilities.

It is noted that the scope of the present invention contemplates interchanging the plating methods and the polishing methods of the first and second preferred embodiments of the invention with each other. For example, the CMP method of the second preferred embodiment can be interchanged with the electropolishing method of the first preferred embodiment. Likewise, the plating method of the first embodiment can be interchanged with the plating method of the second embodiment.

Although only two embodiments of the present invention have been described in detail, the present invention can be implemented with any number of containers using various plating and polishing methods to achieve the objects of the present invention. For example, three chambers may be used in the present invention where the center chamber can be used for polishing while the left and right chambers can be used for plating/depositing.

The present invention as illustrated in FIGS. 6–9 further describes a method and apparatus for intermittently applying the conductive material to the semiconductor substrate and also intermittently polishing the substrate when such conductive material is not being applied to the substrate. When intermittently applying the conductive material, the present invention applies electrical current having a potential difference between the workpiece and the anode so that the conductive material can be applied to the workpiece when such current is applied. Further, reverse current pulses can be applied between the workpiece.

FIG. 6 illustrates a perspective view and FIG. 7 illustrates a cross sectional view of a first anode assembly in accordance with the present invention. The anode assembly 500 includes a unique anode-pad arrangement for both plating and polishing the workpiece 802. Multiple strips of pad 502 are attached, glued, or machined onto a cylindrical anode 504 such that the pad 502 protrudes from the outer surface of the anode 504. Electric power is applied to the cylindrical anode 504 and the cathode workpiece 802. As the cylindrical anode 504 rotates about a first axis 510 and the workpiece 802 rotates about a second axis 512, the workpiece 802 is plated when the anode 504 is facing the workpiece (cathode) 802 with no pad in between, and it is polished when the pad 502 is in mechanical contact with the workpiece 802. The workpiece 802 is further adapted to move side to side via workpiece head assembly (not shown), if needed, as indicated by arrow 520. Such unique plating and polishing results from the anode assembly 500 because of the mechanical polishing effects caused by the brushing of the pad 502 against the workpiece surface, and plating of metal from the anode, electrolyte, and workpiece configuration.

FIG. 8 illustrates a perspective view and FIG. 9 illustrates a cross sectional view of a second anode assembly in accordance with the present invention. The anode assembly 600 also includes a unique anode-pad arrangement for both plating and polishing the workpiece 802. The anode assembly 600 is formed in a donut or circular shape having a hole 606 in the center. Multiple strips of pad 602 are mounted on the anode 604 such that the pad 602 protrudes from the surface of the anode 604. When electric power is applied to the anode 604 and the cathode workpiece 802, and as the anode 604 rotates about a first axis 610 and the workpiece 802 rotates about a second axis 612, the workpiece 802 is plated when the anode 604 is facing the workpiece 802 with no pad in between, and it is polished when the pad 602 is in mechanical contact with the workpiece 802. As described above, such unique plating and polishing results from the anode assembly 600 because of the mechanical polishing effects caused by the brushing of the pad 602 against the workpiece surface. The diameter or size of the anode assembly 600 may also be smaller than the diameter or size of the workpiece 802.

While operating the anode assemblies in FIGS. 6–9, the electrolyte or other solution can be introduced to the mechanical pads 502, 602 from a reservoir (not shown) located in proximity to the anodes 504, 604. In one specific embodiment, the anodes 504, 604 can have an in-channel that includes passageways within the center of anodes 504, 604 and holes that are made in the anode 504, 604, which together provide a path for the solution to be fed to the gap between the anode and the cathode. Alternatively, the electrolyte solution can be dispensed directly onto the anode assemblies 500, 600 through another channel in accordance with the methods described earlier herein.

Additionally, as illustrated in FIG. 7, the electrolyte solution may be contained within a non-conductive chamber 530 that is created around the workpiece. O-rings and other conventional structures, as described earlier herein, may be used to contain the solution within the chamber 530 in this embodiment.

According to the present invention, in any of the embodiments, since mechanical action is used to prevent undesired build-up of a conductor on undesired areas of a wafer surface, the need for leveling agents may be reduced, or needed in a smaller percentage than conventionally used.

In a further embodiment of the present invention, the novel anode assemblies illustrated in FIGS. 6–9 can be used to primarily plate/deposit the conductive material on the workpiece surface without polishing the same surface. This is accomplished when the pad or other fixed feature is used only in proximity of the workpiece surface to improve electrolyte mass transfer.

Figure 10:
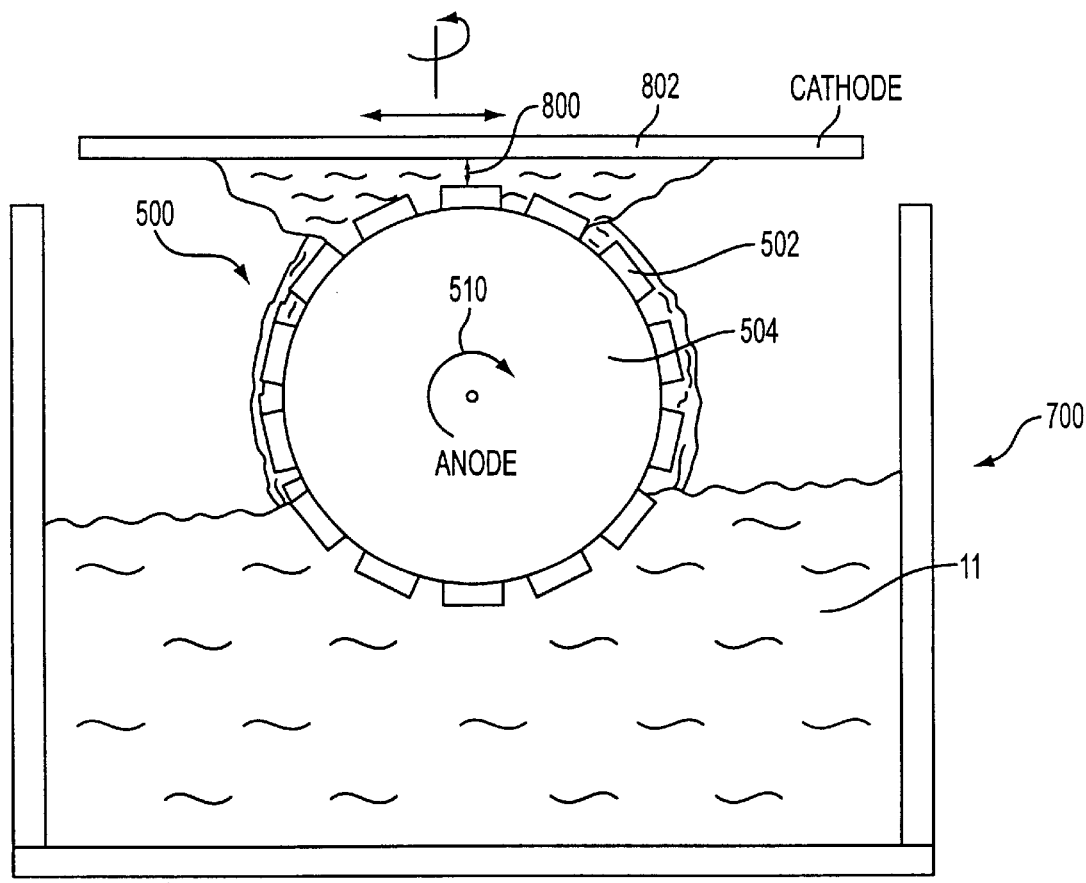
FIG. 10 illustrates a cross sectional view of a "proximity plating" apparatus and method in accordance with the preferred embodiment of the present invention.

For example, FIG. 10 illustrates a cross sectional view of a "proximity plating" apparatus and method in accordance with the present invention. FIG. 10 illustrates a nonconductive chamber 700 having the electrolyte solution 11 disposed therein. The chamber 700 includes the anode assembly 500 having multiple strips of pad 502 or fixed features mounted, or machined onto the cylindrical anode 504. During operation, when the pad strips 502 are rotating about axis 510 and are spaced apart from the workpiece 802 (the pad strips 502 do not make direct contact with the workpiece 802), the workpiece 802 is plated using the electrolyte solution 11. The anode 510 and pad strips 502 should preferably rotate at a rate such that the electrolyte solution 11 is continuous and is applied/splashed to the workpiece 802, and thus forming a closed electrical circuit through the anode assembly 500, electrolyte, and the workpiece (cathode) 802. When a gap 800 is about 0–5 mm and contains a meniscus solution of electrolyte, a very high mass transport results, thereby depositing high quality metal films onto the workpiece surface. Moreover, depending on the type, shape, and structure of the pad or the fixed feature attached to the cylindrical anode 504, the gap 800 may be greater than 5 mm.

In the embodiments described herein, the hardness of the pad or fixture is coupled with the relative speed of travel of the pad to the workpiece. Preferably, the pad should be porous and hard for optimal performance.

The present invention may reduce the need for pulse generating power supplies because the mechanical pulsing that is generated from the movement of the pad relative to the face of the workpiece creates sufficient pulsing. This mechanical pulsing is created as a result of the wafer being in proximity with the pad as it is moved in relation to the workpiece. The benefit of the mechanical pulsing is that it improves grain size, filling efficiency of the contact holes, vias, and trenches, and copper film integrity without the need for power supplies with pulsing capabilities.

Figure 11:
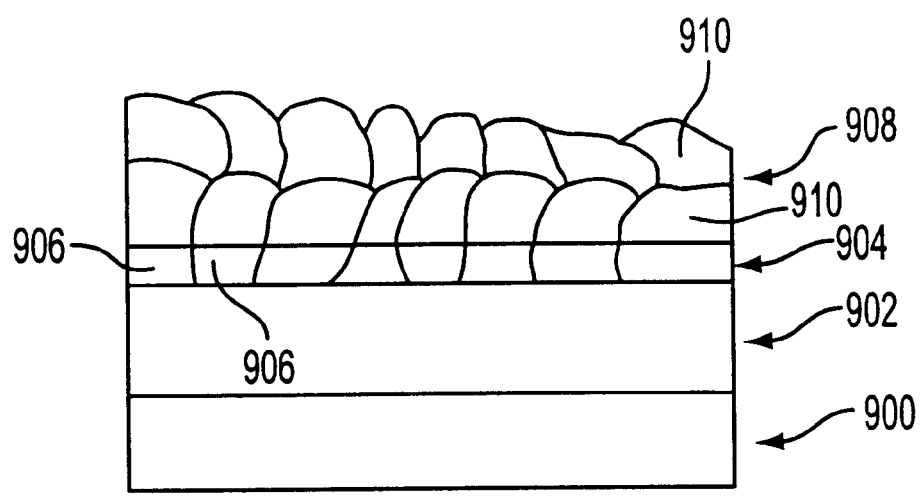
FIG. 11 illustrates a cross sectional view of a substrate having various layers and grains disposed thereon.
Figure 12A:
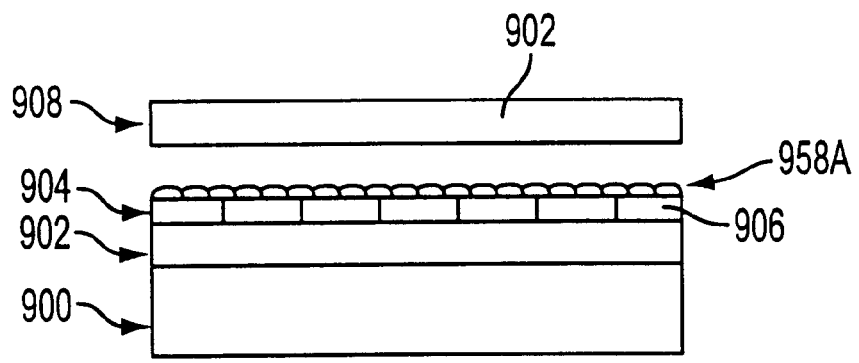
FIGS. 12A–12B illustrate cross sectional views of a method for advantageously affecting the texture of a conductive material in accordance with the preferred embodiment of the present invention.
Figure 12B:
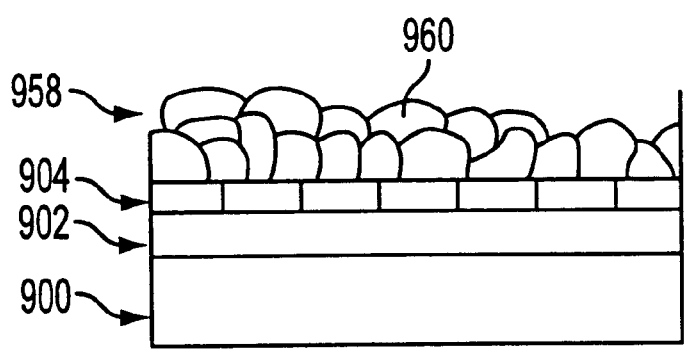

FIGS. 11 and 12A–12B will now be used to describe an improved embodiment of the present invention. It has been determined that the present invention can also advantageously affect the texture of a conductive material that has been applied using a plating process. FIG. 11 illustrates a conventional substrate 900, having deposited thereon a barrier layer 902 and an epitaxial seed layer 904. As illustrated, the seed layer 904 is composed of individual grains 906, which are oriented in a predetermined manner, such as a <111> crystal orientation. After a conventional plating process, the atoms that make up the conductive plating layer 908 applied thereto will, over time, cluster to form grains 910, which grains 910 retain the original crystal orientation of the seed layer 904 disposed below. Accordingly, if the seed layer 904 has a <111> crystal orientation, so will the conductive plating layer 908.

In contrast, the present invention has found that by plating and polishing, as described above, the polishing changes the crystal orientation of the applied conductive plating layer to become more random. As shown in FIG. 12A, upon the application of a first level 958A of atoms in the plating layer 958, the polisher, such as pad 402 previously described, polishes the first level of atoms and causes dangling bonds in the atoms at that first level. Thus, as shown in FIG. 12B, the next level of atoms applied thereover will not form in the same manner as the first level was formed. It has been determined that the action of polishing causes atoms to form in a manner such that, over time, the grains that naturally form as the atoms cluster tend to have a different texture than they would otherwise have. Typically, this texture manifests itself as being more random. This is shown in FIG. 12B as grains 960 that result. Thus, the plating layer 958 will not have the same crystal orientation as the seed layer As the process is repeated, and plating continues and the applied grains are polished, this leads to a plating layer 968 having a greater degree of randomness at the grain level, and, accordingly, a plating layer have more uniform characteristics.

It has been determined that the first few layers of atoms applied over the seed layer 904 can be polished and this will effectively change the resultant grain pattern. It is also possible to continue to polish the atoms applied throughout the plating process, thus continuing to increase this effect.

Although only the above embodiments have been described in detail above, those skilled in the art will readily appreciate that many modifications of the exemplary embodiment are possible without materially departing from the novel teachings and advantages of this invention.

We claim:

1. An apparatus for plating and polishing a surface of a semiconductor workpiece, comprising:
   a first chamber having a plating device for plating the surface of the workpiece; wherein the plating device comprises a pad mounted on a cylindrical anode;
   a second chamber having a polishing device for polishing the surface of the workpiece; and
   a partition separating the first chamber from the second chamber.

2. The apparatus according to claim 1, wherein the cylindrical anode is adapted to rotate about a first axis.

3. The apparatus according to claim 2 wherein the first axis is parallel to the semiconductor workpiece.

4. The apparatus according to claim 3 wherein the polishing device comprises a pad mounted on a cylindrical anode.

5. The apparatus according to claim 4, wherein the cylindrical anode is adapted to rotate about the first axis.

6. The apparatus according to claim 5 further including a workpiece support adapted to support the workpiece during plating and polishing, wherein the workpiece support is adapted to rotate about a second axis that is perpendicular to the first axis.

7. The apparatus according to claim 3 wherein the polishing device comprises a chemical mechanical polishing device.

8. The apparatus according to claim 7, wherein the chemical mechanical polishing device comprises a pad mounted on a cylindrical roller.

9. The apparatus according to claim 8, wherein the cylindrical roller is adapted to rotate about the first axis.

10. The apparatus according to claim 9 further including a workpiece support adapted to support the workpiece during plating and polishing, wherein the workpiece support is adapted to rotate about a second axis that is perpendicular to the first axis.

11. The apparatus according to claim 2 wherein an electrolyte solution is disposed in the first and second chambers during operation.

12. The apparatus according to claim 1 wherein the polishing device comprises a pad mounted on a cylindrical anode.

13. The apparatus according to claim 12 further including a workpiece support adapted to support the workpiece during plating and polishing.

14. The apparatus according to claim 1 wherein the polishing device comprises a chemical mechanical polishing device.

15. The apparatus according to claim 14 wherein the chemical mechanical polishing device comprises a pad mounted on a cylindrical roller.

16. The apparatus according to claim 14 further including a workpiece support adapted to support the workpiece during plating and polishing.

17. The apparatus according to claim 1 further including a workpiece support adapted to support the workpiece during plating and polishing.

18. The apparatus according to claim 17 wherein the workpiece support is adapted to rotate so that a portion of the workpiece is alternately plated and polished.

19. An apparatus for plating and polishing a surface of a semiconductor workpiece, comprising:
    a first chamber having a plating device for plating the surface of the workpiece; wherein the plating device comprises an anode plate mounted in proximity to a bottom side of the first chamber;
    a second chamber having a polishing device for polishing the surface of the workpiece; and
    a partition separating the first chamber from the second chamber.

20. The apparatus according to claim 19 wherein the polishing device comprises a pad mounted on a cylindrical anode.

21. The apparatus according to claim 20 further including a workpiece support adapted to support the workpiece during plating and polishing.

22. The apparatus according to claim 21 wherein the workpiece support is adapted to rotate so that a portion of the workpiece is alternately plated and polished.

23. The apparatus according to claim 19 wherein the polishing device comprises a chemical mechanical polishing device.

24. The apparatus according to claim 23 wherein the chemical mechanical polishing device comprises a pad mounted on a cylindrical roller.

25. The apparatus according to claim 23 further including a workpiece support adapted to support the workpiece during plating and polishing.

26. The apparatus according to claim 19 further including a workpiece support adapted to support the workpiece during plating and polishing.

27. The apparatus according to claim 26 wherein the workpiece support is adapted to rotate so that a portion of the workpiece is alternately plated and polished.

28. An apparatus for plating and polishing a surface of a semiconductor workpiece, comprising:
    a first chamber having a plating device for plating the surface of the workpiece;
    a second chamber having a polishing device for polishing the surface of the workpiece, wherein the polishing device comprises a pad mounted on a cylindrical anode; and
    a partition separating the first chamber from the second chamber.

29. The apparatus according to claim 28, wherein the cylindrical anode is adapted to rotate about a first axis.

30. The apparatus according to claim 28 further including a workpiece support adapted to support the workpiece during plating and polishing.

31. The apparatus according to claim 30 wherein the workpiece support is adapted to rotate so that a portion of the workpiece is alternately plated and polished.

32. An apparatus for plating and polishing a surface of a semiconductor workpiece, comprising:

a first chamber having a plating device for plating the surface of the workpiece;

a second chamber having a polishing device for polishing the surface of the workpiece, wherein the polishing device comprises a chemical mechanical polishing device; and a partition separating the first chamber from the second chamber.

33. The apparatus according to claim 32, wherein the chemical mechanical polishing device comprises a pad mounted on a cylindrical roller.

34. The apparatus according to claim 33, wherein the cylindrical roller is adapted to rotate about a first axis.

35. The apparatus according to claim 32 further including a workpiece support adapted to support the workpiece during plating and polishing.

36. An apparatus for plating and polishing a surface of a semiconductor workpiece, comprising:

a first chamber having a plating device for plating the surface of the workpiece;

a second chamber having a polishing device for polishing the surface of the workpiece;

a partition separating the first chamber from the second chamber; and a workpiece support adapted to support the workpiece during plating and polishing, wherein the workpiece support is adapted to rotate about a second axis and adapted to move from side to side.

37. A method of plating and removal of material from a surface of a semiconductor workpiece, the method comprising the steps of:

plating a conductive material to the surface of the workpiece using an electrolyte solution disposed on the surface of the workpiece, the workpiece being disposed in proximity to an anode; and removing conductive material from the surface of the workpiece during at least certain of the times when the plating is not being performed, wherein one surface portion of the workpiece is repetitively plated while another surface portion of the semiconductor workpiece repetitively has the conductive material removed therefrom.

38. A method according to claim 37, wherein the plating step is performed in a first chamber and the polishing step is performed in a second chamber.

39. A method according to claim 38, wherein the first chamber and the second chamber are separated by a partition.

40. A method according to claim 37, wherein the plating step is performed using one of a brush plating and an electro chemical mechanical deposition.

41. A method according to claim 37, wherein the polishing step is performed using one of an electropolishing and a chemical mechanical polishing.

42. A method according to claim 37, wherein the plating step is performed before the polishing step.

43. A method according to claim 37, wherein the workpiece comprises one of a wafer, a flat panel, and a magnetic film head.

44. An apparatus for plating and polishing a surface of a semiconductor workpiece, comprising:

a first chamber having a plating device for plating the surface of the workpiece;

a second chamber having a polishing device for polishing the surface of the workpiece;

a partition separating the first chamber from the second chamber; and a rotatable workpiece support that allows for alternate plating and polishing of a portion of the workpiece by the first chamber and second chamber, respectively.

45. The apparatus according to claim 44, wherein the plating device comprises a pad mounted on a cylindrical anode.

46. The apparatus according to claim 45, wherein the cylindrical anode is adapted to rotate about a first axis.

47. The apparatus according to claim 44, wherein the plating device comprises an anode plate mounted in proximity to a bottom side of the first chamber.

48. The apparatus according to claim 44, wherein the polishing device comprises a pad mounted on a cylindrical anode.

49. The apparatus according to claim 48, wherein the cylindrical anode is adapted to rotate about a first axis.

50. The apparatus according to claim 44 wherein an electrolyte solution is disposed in the first and second chambers during operation.

* * * * *